United States Patent [19]

Tai

[11] Patent Number: 5,355,396
[45] Date of Patent: Oct. 11, 1994

[54] CIRCUITRY AND METHOD FOR MODULARIZED SINGLE TRANSITION COUNTING

[75] Inventor: Jy-Der Tai, Phoenix, Ariz.

[73] Assignee: Texas Instruments Incorporated, Dallas, Tex.

[21] Appl. No.: 814,881

[22] Filed: Dec. 30, 1991

[51] Int. Cl.⁵ ............................................ H03K 21/00
[52] U.S. Cl. .................................... 377/26; 377/34; 377/38; 377/39; 377/55
[58] Field of Search ................ 377/34, 116, 26, 38, 377/39, 55

[56] References Cited

U.S. PATENT DOCUMENTS

| | | | |
|---|---|---|---|
| 3,020,481 | 2/1962 | Hulst | 377/34 |
| 3,588,461 | 6/1971 | Halsall | 377/34 |
| 4,408,336 | 10/1983 | Das Gupta | 377/116 |
| 4,780,894 | 10/1988 | Watkins et al. | 377/34 |
| 4,974,241 | 11/1990 | McClure et al. | 377/116 |
| 5,097,491 | 3/1992 | Hall | 377/34 |
| 5,164,968 | 11/1992 | Otto | 377/34 |

Primary Examiner—John S. Heyman
Attorney, Agent, or Firm—W. James Brady, III; Richard L. Donaldson

[57] ABSTRACT

A method and circuitry are provided for modularized single transition counting. A count signal is provided on a count line (436). A single transition count is modified in response to the count signal. The single transition count has a plurality of bits (418, 416) provided by at least one first module (404) and at least one second module (406). The first (404) and second (406) modules are alternately coupled in series to an input module (402) so that one (404) of the first and second modules has an input (460a, 466a) coupled to an output (420, 468) of the input module (402) and so that each additional one (406) of the first and second modules has an input (482a, 488a) coupled to an output (472a, 478a) of an associated one (404) of the second and first modules, respectively.

4 Claims, 3 Drawing Sheets

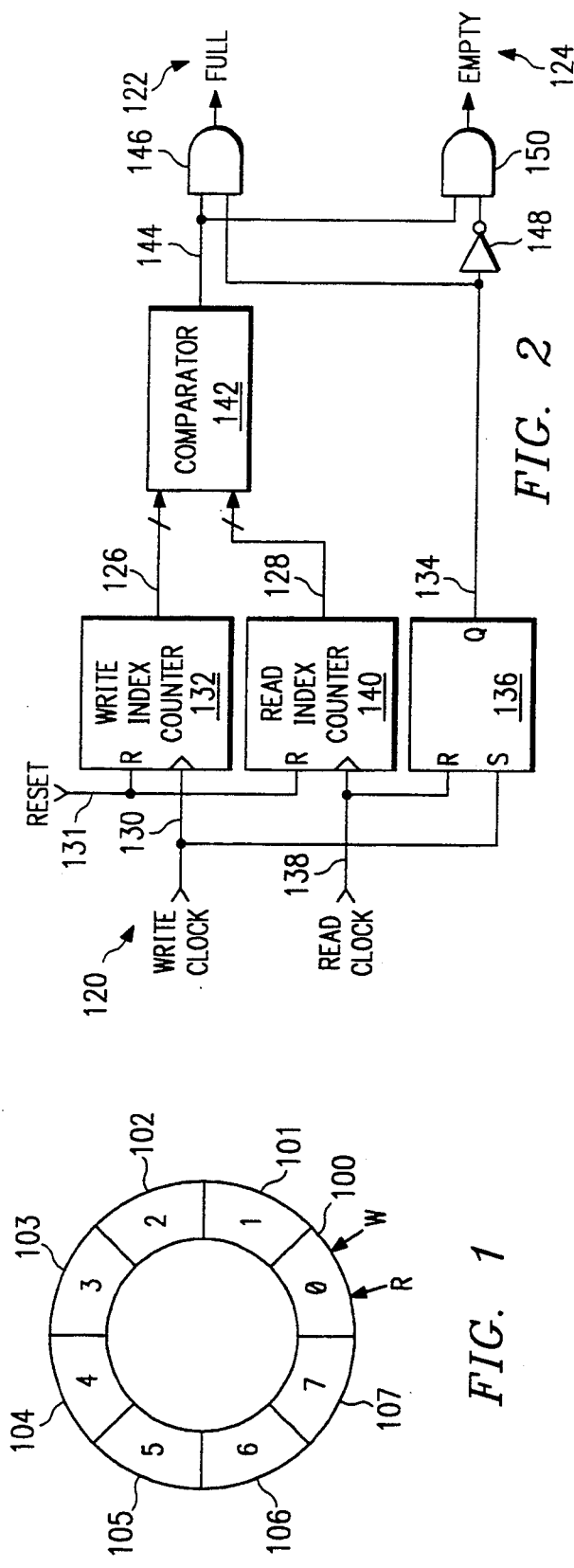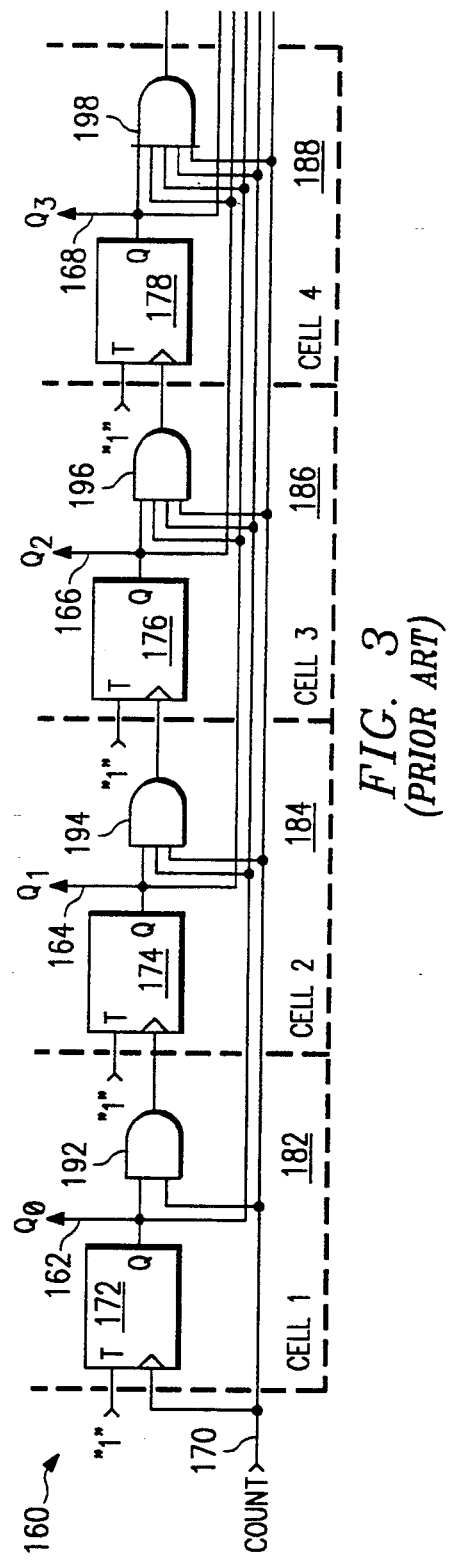

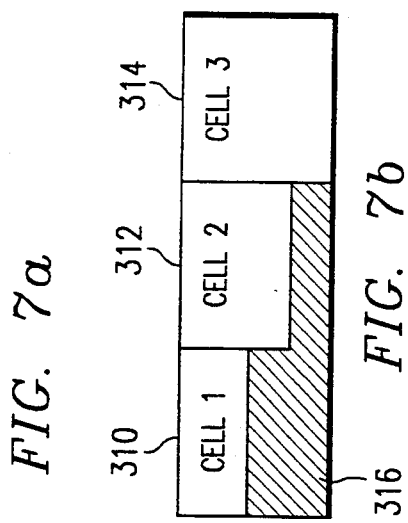
FIG. 6a
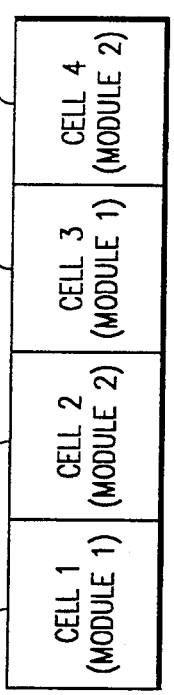
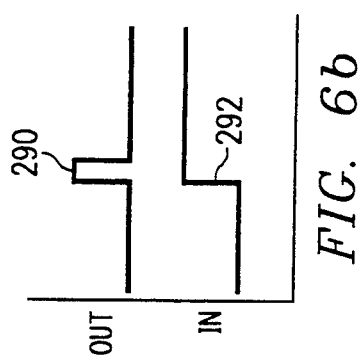
FIG. 6b
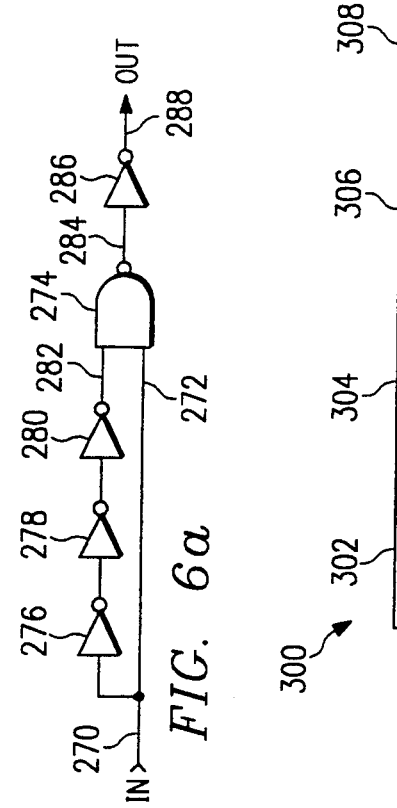
FIG. 7a
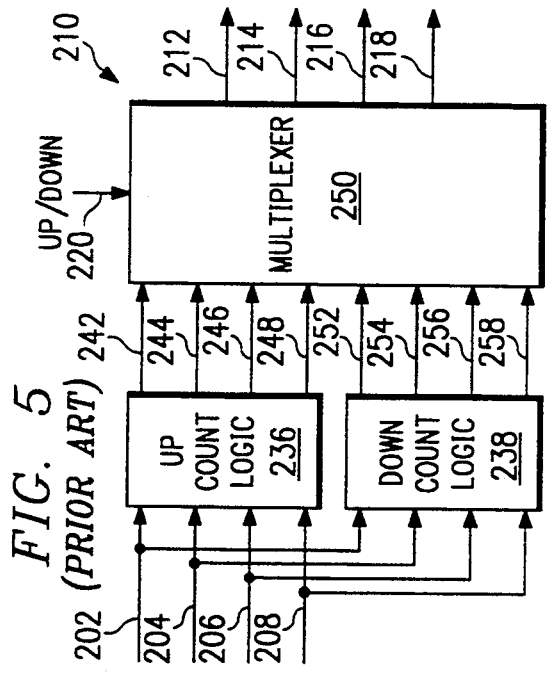
FIG. 7b
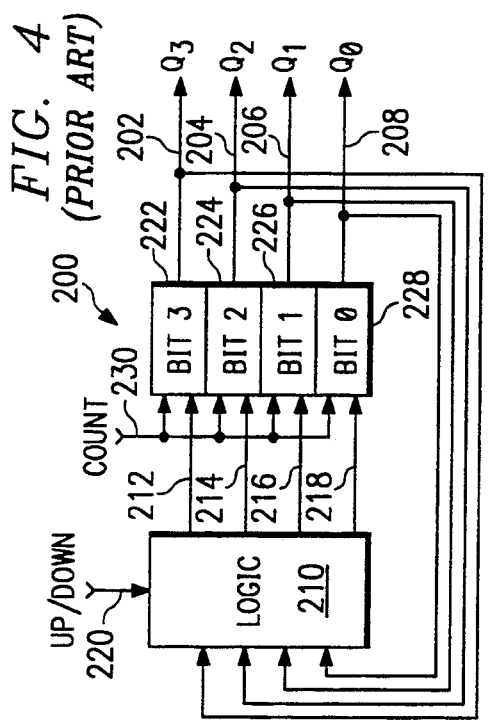
FIG. 4 (PRIOR ART)
FIG. 5 (PRIOR ART)

5,355,396

CIRCUITRY AND METHOD FOR MODULARIZED SINGLE TRANSITION COUNTING

CROSS-REFERENCE TO RELATED APPLICATIONS

This application is related to U.S. patent application Ser. No. 07/814,838, now U.S. Pat. No. 5,222,572, filed concurrently herewith, entitled "Circuitry and Method for Variable Single Transition Counting".

TECHNICAL FIELD OF THE INVENTION

This invention relates in general to electronic circuitry and in particular to a method and circuitry for modularized single transition counting.

BACKGROUND OF THE INVENTION

In a typical first-in-first-out ("FIFO") memory, a write index and a read index are used to determine whether the FIFO is empty or full. The write and read indices may be maintained by a counter. If a synchronous binary counter is used to maintain the write and read indices, then two or more digital logic bits of the synchronous binary counter may simultaneously change at a particular time in response to a clock signal, resulting in undesirable transition noise and complex timing conditions. If a single transition counter is used to maintain the write and read indices, then only one digital logic bit of the counter changes in response to a particular clock signal.

Nevertheless, a traditional single transition counter is significantly larger and slower than a typical synchronous binary counter, because a traditional single transition counter requires additional circuitry for extensive combination logic to implement the single transition counting approach, particularly when large bit counts are to be achieved. Moreover, the additional combination logic circuitry requires increased power. Also, since traditional single transition counters require extensive combination logic, they cannot be modularized and repeatedly duplicated as bits are added to the counter to achieve a predetermined maximum count. Modularization is particularly important for application specific integrated circuit ("ASIC") compiler programs that produce an integrated circuit design based upon parameters specified for a particular integrated circuit application. By repeatedly duplicating identical modules, integrated circuit designs produced by ASIC compiler programs become more simplified, easier to troubleshoot, and easier to analyze in terms of operating characteristics. The extensive combination logic of traditional single transition counters further restricts the maximum counting speed of such counters due to signal delays through the combination logic gates. For up/down counting, a traditional up/down counter requires a first set of combination logic for incrementing the count value, along with a second set of combination logic for decrementing the count value. In addition to the required combination logic, a traditional up-down counter further requires a multiplexer to selectively output either the incremented or decremented count value, thereby requiring even more circuitry, which is undesirable.

Consequently, a need has arisen for a method and circuitry for modularized single transition counting, which substantially overcomes shortcomings of synchronous binary counters, of traditional single transition counters, and of traditional up-down counters.

SUMMARY OF THE INVENTION

In a method and circuitry for modularized single transition counting, a count signal is provided on a count line. A single transition count is modified in response to the count signal. The single transition count has a plurality of bits provided by at least one first module and at least one second module. The first and second modules are alternately coupled in series to an input module so that one of the first and second modules has an input coupled to an output of the input module and so that each additional one of the first and second modules has an input coupled to an output of an associated one of the second and first modules, respectively.

It is a technical advantage of the present invention that only one bit of the single transition count changes in response to the count signal.

It is another technical advantage of the present invention that extensive combination logic is not required, even when large bit counts are to be achieved.

It is yet another technical advantage of the present invention that extensive combination logic is not required, such that power requirements are decreased.

It is a further technical advantage of the present invention that extensive combination logic is not required, such that a maximum counting speed is increased.

It is yet a further technical advantage of the present invention that modules may be repeatedly duplicated as bits are added to the single transition count in order to achieve a predetermined maximum count.

In still another technical advantage of the present invention, modules may be repeatedly duplicated as bits are added to the single transition count, such that ASIC compiler programs are more simplified, easier to troubleshoot, and easier to analyze in terms of operating characteristics.

BRIEF DESCRIPTION OF THE DRAWINGS

For a more complete understanding of the present invention, and the advantages thereof, reference is now made to the following description, taken in conjunction with the accompanying drawings, in which:

FIG. 1 is a conceptual representation of a FIFO;

FIG. 2 is a schematic block diagram of an exemplary embodiment of circuitry for generating a FULL flag and an EMPTY flag for a FIFO, based upon a comparison of write and read indices;

FIG. 3 is a schematic electrical circuit diagram of a typical synchronous binary counter according to the prior art;

FIG. 4 is a schematic electrical circuit diagram of a traditional gray-code single transition counter according to the prior art;

FIG. 5 is a schematic electrical circuit diagram of logic of a traditional up-down counter for providing an incremented or decremented count according to the prior art;

FIG. 6a is a schematic diagram of split logic paths which may operate as a pulse generating gate;

FIG. 6b is a timing diagram of input and output signals of the circuit shown in FIG. 6a;

FIG. 7a is a first conceptual layout of cells of an integrated circuit;

FIG. 7b is a second conceptual layout of cells of an integrated circuit; and

DETAILED DESCRIPTION OF THE PREFERRED EMBODIMENT

Figure 8:
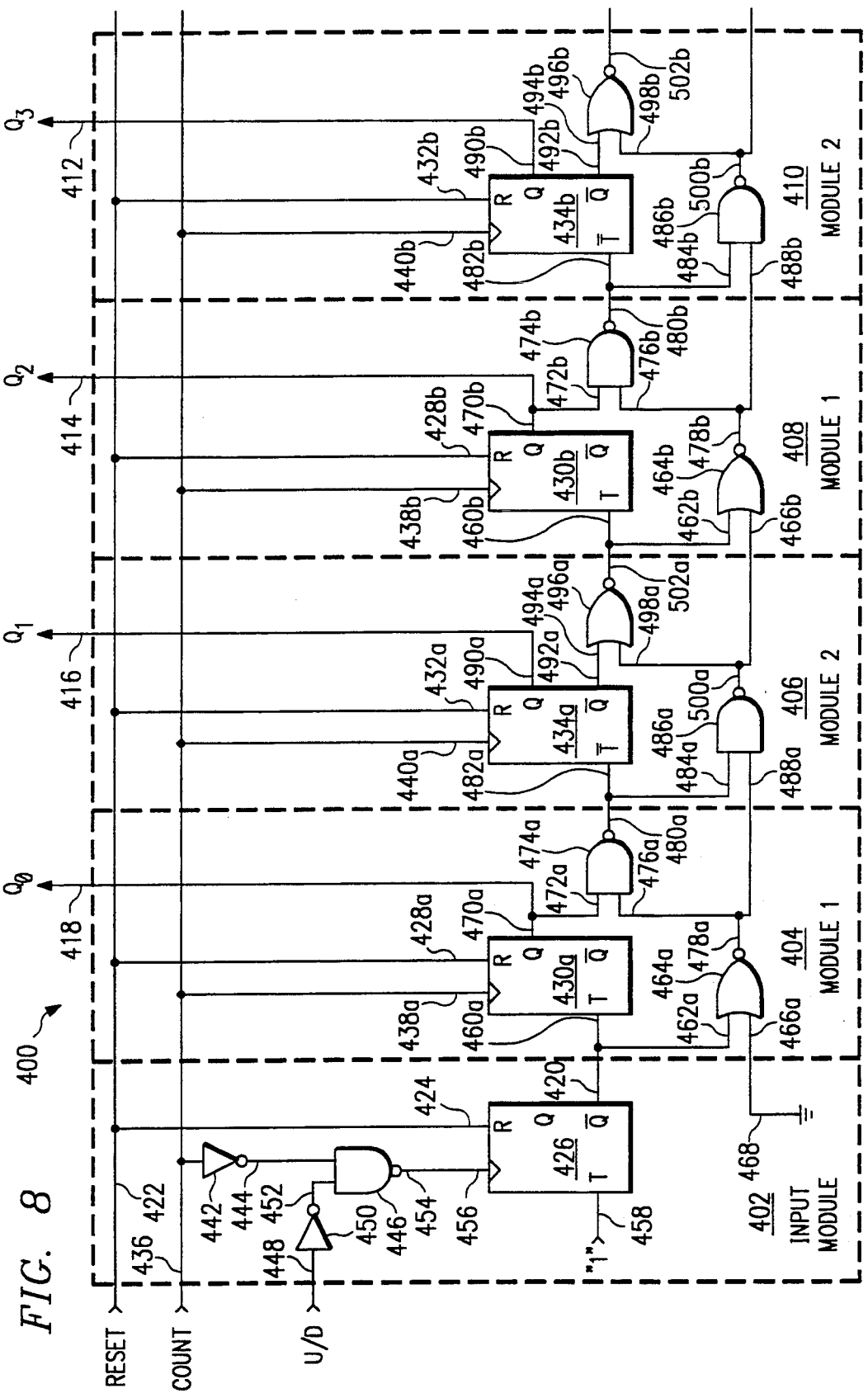
FIG. 8 is a schematic electrical circuit diagram of a modularized gray-code single transition counter of the preferred embodiment.

The preferred embodiment of the present invention and its advantages are best understood by referring to FIGS. 1 through 8 of the drawings, like numerals being used for like and corresponding parts of the various drawings.

FIG. 1 is a conceptual representation of a FIFO. Memory locations 100, 101, 102, 103, 104, 105, 106, and 107 are arranged conceptually in a circular fashion as shown in FIG. 1. A write index W indicates a memory location at which new data are to be stored. After new data are stored at the indicated memory location, write index W is incremented to indicate the next adjacent memory location. A read index R indicates a memory location from which data are to be read. After data are read from the indicated memory location, read index R is incremented to indicate the next adjacent memory location.

As shown in FIG. 1, write index W initially indicates that new data are to be written at memory location 100. After data are written to memory location 100, write index W is incremented to indicate that new data are to be written at the next adjacent memory location 101. As additional data are written to sequential memory locations in the FIFO, write index W is incremented after each write operation to indicate the next adjacent memory location, until data are ultimately written at memory location 107, at which time write index W is reset to indicate memory location 100.

As shown in FIG. 1, read index R initially indicates that data are to be read from memory location 100. After data are read from memory location 100, read index R is incremented to indicate that data are to be read from the next adjacent memory location 101. As additional data are read from sequential memory locations in the FIFO, read index R is incremented after each read operation to indicate the next adjacent memory location, until data are ultimately read from memory location 107, at which time read index R is reset to indicate memory location 100.

If write index W is ever incremented to indicate a memory location which is also indicated by read index R, then the FIFO is full, and no additional data may be written to the FIFO until data are read from the indicated memory location such that read index R is incremented to no longer indicate the same memory location as write index W. If read index R is ever incremented to indicate a memory location which is also indicated by write index W, then the FIFO is empty, and no additional data may be read from the FIFO until data are written to the indicated memory location such that write index W is incremented to no longer indicate the same memory location as read index R.

FIG. 2 is a schematic block diagram of an exemplary embodiment of circuitry 120 for generating a FULL flag 122 and an EMPTY flag 124 for a FIFO, based upon a comparison of a value of write index W on lines 126 and a value of read index R on lines 128. When data are written to the FIFO, a WRITE CLOCK pulse is input on line 130, such that a write index counter 132 increments write index W, and such that a latch 136 sets an output 134 to a logic "1". When data are read from the FIFO, a READ CLOCK pulse is input on line 138, such that a read index counter 140 increments read index R, and such that latch 136 resets output 134 to a logic "0". A comparator 142 compares write index W against read index R, such that a signal 144 is set to a logic "1" if write index W is equal to read index R. Consequently, if signal 144 is set to a logic "1" and if output 134 is set to a logic "1" then an AND gate 146 sets FULL flag 122 to a logic "1" in order to indicate that the FIFO is full, because output 134 and signal 144 together indicate write index W was incremented to indicate the same memory location as read index R If signal 144 is set to a logic "1", and if output 134 is reset to a logic "0" then read index R was incremented to indicate the same memory location as write index W; thus, an inverter 148 inverts output 134 such that an AND gate 150 sets EMPTY flag 124 to a logic "1" in order to indicate that the FIFO is empty Latch 136 may be replaced by alternative circuitry for outputting a signal equivalent to output 134, in order to indicate whether the FIFO is either full or empty when write index W is equal to read index R. Upon resetting circuitry 120 of FIG. 2, output 134 of flip-flop 136 is reset to a logic "0"; moreover, write count 126 and read count 128 are each reset to a zero count by asserting reset line 131, such that signal 144 of comparator 142 is set to a logic "1" and such that EMPTY flag 124 is consequently set to a logic "1" in order to indicate that the FIFO is empty FIG. 3 is a schematic electrical circuit diagram of a typical synchronous binary counter 160 according to the prior art for counting either the write or read indices for a FIFO. The binary count is output by counter 160 on signal lines 162 (least significant bit $Q_0$), 164 ($Q_1$), 166 ($Q_2$), and 168 (most significant bit $Q_3$). Table 1 illustrates sequential values output by T-type flip-flops 172, 174, 176, and 178 on signal lines 162–168, respectively, as the values on signal lines 162–168 are incremented in response to positive-edge transitions of a COUNT signal line 170.

TABLE 1

| BINARY COUNT | | | | |
|---|---|---|---|---|
| $Q_3$(MSB) | $Q_2$ | $Q_1$ | $Q_0$(LSB) | DECIMAL VALUE |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |
| 1 | 0 | 1 | 0 | 10 |
| 1 | 0 | 1 | 1 | 11 |
| 1 | 1 | 0 | 0 | 12 |
| 1 | 1 | 0 | 1 | 13 |
| 1 | 1 | 1 | 0 | 14 |
| 1 | 1 | 1 | 1 | 15 |
| 0 | 0 | 0 | 0 | 0 |

In Table 1, two or more binary outputs simultaneously change when the binary count's decimal value increments from 1 to 2, from 3 to 4, from 5 to 6, from 7 to 8, from 9 to 10, from 11 to 12, from 13 to 14, and from 15 to 0. When two or more binary outputs change simultaneously, undesirable transition glitches might trigger latches after either FULL flag 122 or EMPTY flag 124 is set. Moreover, none of cells 182 (Cell 1), 184 (Cell 2), 186 (Cell 3), and 188 (Cell 4) of synchronous binary counter 160 are identical, because AND gates 192, 194, 196, and 198 have varying numbers of inputs. Consequently, counter 160 is not modularized, because none of cells 182–188 may be repeatedly duplicated as bits are added to counter 160 to achieve a predetermined maximum count.

FIG. 4 is a schematic electrical circuit diagram of a traditional gray-code single transition counter 200 according to the prior art. Counter 200 may also be implemented to provide a synchronous binary count (shown in TABLE 1) by suitably modifying logic 210 of FIG. 4. Table 2 illustrates sequential gray-code values output by D-type flip-flops 222 (Bit 3), 224 (Bit 2), 226 (Bit 1), and 228 (Bit 0), on outputs 202 (most significant bit $Q_3$), 204 ($Q_2$), 206 ($Q_1$), and 208 (least significant bit $Q_0$), respectively, as the values on outputs 202–208 are incremented in response to positive edge transitions of a COUNT signal line 230.

TABLE 2

GRAY-CODE SINGLE TRANSITION COUNT

| $Q_3$(MSB) | $Q_2$ | $Q_1$ | $Q_0$(LSB) | DECIMAL VALUE |
|---|---|---|---|---|
| 0 | 0 | 0 | 0 | 0 |
| 0 | 0 | 0 | 1 | 1 |
| 0 | 0 | 1 | 1 | 2 |
| 0 | 0 | 1 | 0 | 3 |
| 0 | 1 | 1 | 0 | 4 |
| 0 | 1 | 1 | 1 | 5 |
| 0 | 1 | 0 | 1 | 6 |
| 0 | 1 | 0 | 0 | 7 |
| 1 | 1 | 0 | 0 | 8 |
| 1 | 1 | 0 | 1 | 9 |
| 1 | 1 | 1 | 1 | 10 |
| 1 | 1 | 1 | 0 | 11 |
| 1 | 0 | 1 | 0 | 12 |
| 1 | 0 | 1 | 1 | 13 |
| 1 | 0 | 0 | 1 | 14 |
| 1 | 0 | 0 | 0 | 15 |
| 0 | 0 | 0 | 0 | 0 |

Logic 210 is coupled to flip-flops 222–228 by outputs 212, 214, 216, and 218, respectively. Logic 210 passes outputs 202–208 through combination logic gates to determine either an incremented or decremented gray-code single transition count in accordance with TABLE 2. If an up/down (U/D) signal 220 is high, then logic 210 provides the incremented gray-code single transition count on outputs 212–218 to latches 222–228; otherwise, logic 210 provides the decremented gray-code single transition count on outputs 212–218 to latches 222–228. When COUNT signal line 230 transitions from low to high, latches 222–228 latch the values of outputs 212–218 on outputs 202–208. The combination logic gates of logic 210 are not modularized, because they may not be repeatedly duplicated as bits are added to counter 200 to achieve a predetermined maximum count. Moreover, combination logic 210 occupies a significant amount of integrated circuit area, consumes a significant amount of power, interferes with troubleshooting, and complicates analysis of counter 200 in terms of operating characteristics.

FIG. 5 is a schematic electrical circuit diagram of logic 210 of counter 200 of FIG. 4 for providing an incremented or decremented count, based upon up/down (U/D) signal 220. Outputs 202–208 are provided to an up-count logic 236 and to a down-count logic 238. Up-count logic 236 provides an incremented count to a multiplexer 250 on outputs 242, 244, 246, and 248, based upon outputs 202–208. Down-count logic 238 provides a decremented count to multiplexer 250 on outputs 252, 254, 256, and 258, based upon outputs 202–208. If up/down (U/D) signal 220 is high, then multiplexer 250 connects output 242 to an output 212, output 244 to an output 214, output 246 to an output 216, and output 248 to an output 218; otherwise, multiplexer 250 connects output 252 to output 212, output 254 to output 214, output 256 to output 216, and output 258 to output 218. The additional circuitry required by logic 210 of FIG. 5, in order to selectively output either the incremented or decremented count value, is undesirable.

FIGS. 6a is a schematic diagram of split logic paths which may operate as a pulse generating gate. In FIG. 6a, an input signal 270 is coupled to a first input 272 of a NAND gate 274 and is also coupled through inverters 276, 278, and 280 to a second input 282 of NAND gate 274. An output 284 of NAND gate 274 is coupled through an inverter 286 to an output signal 288. FIG. 6b is a timing diagram of input signal 270 and of output signal 288 of FIG. 6a. As FIG. 6b illustrates, a short pulse 290 is produced on output signal 288 when input signal 270 of FIG. 6a transitions from low to high at a positive edge 292.

In FIG. 6a, input signal 270 is divided into two separate paths, and the two paths are then recombined by NAND gate 274 into a single path ultimately leading to output signal 288. As combination logic becomes more extensive throughout a circuit, it is more likely that a signal path will be divided into separate paths, which are later recombined into a single path, thereby increasing the likelihood of unexpected glitches such as pulse 290 in FIG. 6b. For this reason and for other reasons mentioned above, the traditional counter of FIGS. 4 and 5 is not preferred.

FIG. 7a is a first conceptual layout 300 of four cells 302 (Cell 1), 304 (Cell 2), 306 (Cell 3), and 308 (Cell 4) in an integrated circuit. As FIG. 7a illustrates, cells 302 and 306 are identical reproductions of a Module 1. Cells 304 and 308 are identical reproductions of a Module 2. Moreover, Module 1 and Module 2 are substantially equal to each other in size. The reproduction of modules having substantially equal sizes is advantageous for application specific integrated circuit ("ASIC") compiler programs.

FIG. 7b is a second conceptual layout of cells of an integrated circuit. In FIG. 7b, cells 310 (Cell 1), 312 (Cell 2), and 314 (Cell 3) have unequal sizes and are not identical, thereby resulting in undesirable complexity in designs produced by ASIC compiler programs, and further resulting in inefficient space utilization, illustrated by space 316 in FIG. 7b, which frequently exists in traditional non-cascadable binary and gray-code counters.

FIG. 8 is a schematic electrical circuit diagram of a modularized gray-code single transition counter 400 of the preferred embodiment. An input module 402 is coupled to a cell 404, which is coupled to a cell 406. Cell 406 is coupled to a cell 408, which is coupled to a cell 410. As FIG. 8 illustrates, cells 404 and 408 are identical reproductions of Module 1. Cells 406 and 410 are identical reproductions of Module 2. Counter 400 provides a gray-code single transition count on outputs 412 (most significant bit $Q_3$), 414 ($Q_2$), 416 ($Q_1$), and 418 (least significant bit $Q_0$). Output 412 is provided by cell 410, output 414 is provided by cell 408, output 416 is provided by cell 406, and output 418 is provided by cell 404. By alternately duplicating Module 1 and Module 2 in the same manner as shown in FIG. 8, bits may be added to modularized gray-code single transition counter 400 to achieve a predetermined maximum output. For example, an additional bit ($Q_4$) (not shown) may be added as the most significant bit of modularized gray-code single transition counter 400 by coupling cell 410 to an additional cell comprising an exact duplication of Module 1.

In addition to outputs 412–418, an "invisible" bit is provided by input module 402 on an inverted output 420 of flip-flop 426. Table 3 illustrates sequential gray-code values output by counter 400, along with corresponding values of the "invisible" bit provided on output 420 for both incrementing and decrementing modes.

TABLE 3

| | | | GRAY-CODE SINGLE TRANSITION COUNT | | |
|---|---|---|---|---|---|
| $Q_3$ (MSB) | $Q_2$ | $Q_1$ | $Q_0$ (LSB) | INVISIBLE BIT (INCREMENTING) | INVISIBLE BIT (DECREMENTING) | DECIMAL VALUE |
| 0 | 0 | 0 | 0 | 1 | 0 | 0 |
| 0 | 0 | 0 | 1 | 0 | 1 | 1 |
| 0 | 0 | 1 | 1 | 1 | 0 | 2 |
| 0 | 0 | 1 | 0 | 0 | 1 | 3 |
| 0 | 1 | 1 | 0 | 1 | 0 | 4 |
| 0 | 1 | 1 | 1 | 0 | 1 | 5 |
| 0 | 1 | 0 | 1 | 1 | 0 | 6 |
| 0 | 1 | 0 | 0 | 0 | 1 | 7 |
| 1 | 1 | 0 | 0 | 1 | 0 | 8 |
| 1 | 1 | 0 | 1 | 0 | 1 | 9 |
| 1 | 1 | 1 | 1 | 1 | 0 | 10 |
| 1 | 1 | 1 | 0 | 0 | 1 | 11 |
| 1 | 0 | 1 | 0 | 1 | 0 | 12 |
| 1 | 0 | 1 | 1 | 0 | 1 | 13 |
| 1 | 0 | 0 | 1 | 1 | 0 | 14 |
| 1 | 0 | 0 | 0 | 0 | 1 | 15 |
| 0 | 0 | 0 | 0 | 1 | 0 | 0 |

As Table 3 illustrates, the "invisible" bit toggles between "0" and "1" at each successive count. At each successive count, $Q_0$ toggles between "0" and "1" only if the "invisible" bit of the previous count has a logic value of "1". At each successive count, $Q_1$ toggles between "0" and "1" only if $Q_0$ of the previous count has a logic value of "1" and if the "invisible" bit of the previous count has a logic value of "0". At each successive count, $Q_2$ toggles between "0" and "1" only if $Q_1$ of the previous count has a logic value of "1" and if $Q_0$ and the "invisible" bit of the previous count each have a logic value of "0". At each successive count, $Q_3$ toggles between "0" and "1" only if $Q_2$ of the previous count has a logic value of "1" and if $Q_1$, $Q_0$ and the "invisible" bit of the previous count each have a logic value of "0". Applying these rules of Table 3, the "invisible" bit controls a direction of counting to determine whether a successive count is incremented or decremented relative to the previous count.

In FIG. 8, a RESET signal line 422 is coupled to a reset input 424 of a T-type flip-flop 426, to reset inputs 428a and 428b of T-type flip-flops 430a and 430b, respectively, and to reset inputs 432a and 432b of T-type flip-flops 434a and 434b, respectively. A COUNT signal line 436 is coupled to clock inputs 438a and 438b of flip-flops 430a and 430b, respectively, and to clock inputs 440a and 440b of flip-flops 434a and 434b, respectively. COUNT signal line 436 is further coupled through an inverter 442 to a first input 444 of a NAND gate 446. An up/down (U/D) signal 448 is coupled through an inverter 450 to a second input 452 of NAND gate 446. An output 454 of NAND gate 446 is coupled to a clock input 456 of flip-flop 426. An input 458 of flip-flop 426 is coupled to a logic "1". Inverted output 420 of flip-flop 426 is coupled to an input 460a of flip-flop 430a and also to a first input 462a of a NOR gate 464a. A second input 466a of NOR gate 464a is coupled to a ground line 468. A non-inverted output 470a of flip-flop 430a is coupled to output 418 ($Q_0$) and to a first input 472a of a NAND gate 474a. A second input 476a of NAND gate 474a is coupled to an output 478a of NOR gate 464a. An output 480a of NAND gate 474a is coupled to an inverted input 482a of flip-flop 434a and to a first input 484a of a NAND gate 486a. A second input 488a of NAND gate 486a is coupled to output 478a of NOR gate 464a. A non-inverted output 490a of flip-flop 434a is coupled to output 416 ($Q_1$). An inverted output 492a of flip-flop 434a is coupled to a first input 494a of a NOR gate 496a. A second input 498a of NOR gate 496a is coupled to an output 500a of NAND gate 486a. An output 502a of NOR gate 496a is coupled to an input 460b of flip-flop 430b and to a first input 462b of a NOR gate 464b. A second input 466b of NOR gate 464b is coupled to output 500a of NAND gate 486a. A non-inverted output 470b of flip-flop 430b is coupled to output 414 ($Q_2$) and to a first input 472b of a NAND gate 474b. A second input 476b of NAND gate 474b is coupled to an output 478b of NOR gate 464b. An output 480b of NAND gate 474b is coupled to an inverted input 482b of flip-flop 434b and to a first input 484b of a NAND gate 486b. A second input 488b of NAND gate 486b is coupled to output 478b of NOR gate 464b. A non-inverted output 490b of flip-flop 434b is coupled to output 412 ($Q_3$). An inverted output 492b of flip-flop of 434b is coupled to a first input 494b of a NOR gate 496b. A second input 498b of NOR gate 496b is coupled to an output 500b of NAND gate 484b. An output 502b of NOR gate 496b and output 500b of NAND gate 486b may be optionally coupled to an additional cell comprising a reproduction of Module 1, in the same manner in which cell 406 is coupled to cell 408.

Modularized gray-code single transition counter 400 operates in accordance with the rules described above in connection with Table 3. When RESET signal line 422 is asserted, outputs $Q_3$, $Q_2$, $Q_1$ and $Q_0$ are each reset to a logic value of "0" outputs 420 and 492a–b are each set to a logic value of "1" and outputs 470a–b and 490a–b are each reset to a logic value of "0".

In an alternative embodiment, RESET signal line 422 is coupled to one or more set inputs (not shown) of flip-flops 430a, 430b, 434a and 434b, such that one or more of outputs $Q_3$, $Q_2$, $Q_1$ and $Q_0$ is set to a logic value of "1" when RESET signal line 422 is asserted. In this manner, outputs $Q_3$, $Q_2$, $Q_1$ and $Q_0$ can be initialized to any predetermined value when RESET signal line 422 is asserted, based upon whether RESET signal line 422 is coupled to a reset input or to a set input of each of flip-flops 430a, 430b, 434a and 434b. Similarly, RESET signal line 422 alternatively can be coupled to a set input (not shown) of flip flop 426, such that output 420 is reset to a logic value of "0" when RESET signal line 422 is asserted. In this manner, the "invisible" bit provided by output 420 of flip-flop 426 can be initialized to a logic value of either "1" or "0" based upon whether RESET signal line 422 is coupled to a reset input or to a set input of flip-flop 426.

In the preferred embodiment, up/down (U/D) signal 448 is initially reset to a low (logic "0") state, resulting in input 452 of NAND gate 446 being high (logic "1"); consequently, if COUNT signal line 436 is low, then input 444 of NAND gate 446 is high, and output 454 of NAND gate 446 is consequently low, thereby mirroring the logic state of COUNT signal line 436. Similarly, if COUNT signal line 436 is high, then input 444 of NAND gate 446 is low, and output 454 of NAND gate 446 is consequently high, thereby mirroring the logic state of COUNT signal line 436. Since output 454 of NAND gate 446 (coupled to clock input 456 of flip-flop 426) mirrors the logic state of count signal 436 when up/down (U/D) signal 448 is low, and since output 420 ("invisible" bit) is initially set to a logic value of "1" each positive edge transition of COUNT signal line 436 initially results in an incremented gray-code single transition count on outputs 412–418 ($Q_3$, $Q_2$, $Q_1$, $Q_0$) in accordance with the rules discussed above in connection with Table 3.

Output 470a ($Q_0$) of flip-flop 430a toggles between "Q" and "A" if "invisible" bit output 420 (coupled to status input 460a of flip-flop 430a) has a logic value of "1".

Output 490a ($Q_1$) of flip-flop 434a toggles between "0" and "1" if output 480a of NAND gate 474a (coupled to inverted status input 482a of flip-flop 434a) has a logic value of "0" which indicates that output 470a ($Q_0$) has a logic value of "1" and also that "invisible" bit output 420 has a logic value of "0" (indicated by indication output 478a of NOR gate 464a having a logic value of "1").

Output 470b ($Q_2$) of flip-flop 430b toggles between "0" and "1" if output 502a of NOR gate 496a (coupled to status input 460b of flip-flop 430b) has a logic value of "1" which indicates that output 490a ($Q_1$) has a logic value of "1" (indicated by inverted output 492a having a logic value of "0" and also that output 470a ($Q_0$) and "invisible" bit output 420 each have logic a value of "0" (indicated by output 478a of NOR gate 464a having a logic value of "2" and by output 480a of NAND gate 474a also having a logic value of "1" resulting in indication output 500a of NAND gate 486a having a logic value of "0")

Output 490b ($Q_3$) of flip-flop 434b toggles between "0" and "1" if output 480b of NAND gate 474b (coupled to inverted status input 482b of flip-flop 434b ) has a logic value of "0", which indicates that output 470b ($Q_2$) has a logic value of "1" and also that output 490a ($Q_1$), output 470a ($Q_0$) and "invisible" bit output 420 each have a logic value of "0" (indicated by output 478a of NOR gate 464a having a logic value of "1" and by output 480a of NAND gate 474a also having a logic value of "1", resulting in output 500a of NAND gate 486a having a logic value of "0" and further indicated by inverted output 492a of flip-flop 434a having a logic value of "1", resulting in inputs 462b and 466b of NOR gate 464b each having a logic value of "0", such that indication output 478b of NOR gate 464b has a logic value of "1").

Consequently, modularized gray-code single transition counter 400 outputs a gray-code single transition count in accordance with the rules described above in connection with Table 3. Applying the rules of Table 3, "invisible" bit output 420 controls a direction of counting to determine whether a successive count is incremented or decremented relative to the previous count.

When RESET signal line 422 is asserted, outputs 412 ($Q_3$), 414 ($Q_2$), 416 ($Q_1$) and 418 ($Q_0$) each have a logic value of "0". The assertion of RESET signal line 422 also results in "invisible" bit output 420 being set to a logic value of "1", thereby placing gray-code single transition counter 400 in an incrementing mode according to Table 3. Subsequently, gray-code single transition counter 400 may be placed in a decrementing mode according to Table 3 by toggling the "invisible" bit output 420 between "0" and "1" while simultaneously leaving outputs 412 ($Q_3$), 414 ($Q_2$), 416 ($Q_1$) and 418 ($Q_0$) unchanged. Thus, gray-code single transition counter 400 may be placed in a decrementing mode by applying a positive pulse to up/down (U/D) signal 448 at any time while COUNT signal line 436 has a low state; in that case, the positive pulse applied to up/down (U/D) signal 448 results in a negative pulse at input 452 of NAND gate 446, consequently resulting in a positive pulse at output 454 of NAND gate 446 which is applied to clock input 456 of flip-flop 426, thereby toggling "invisible" bit output 420 without changing the outputs of flip-flops 430a–b and 434a–b. After such a positive pulse is applied to up/down (U/D) signal 448, up/down (U/D) signal 448 returns to its previous low state, and output 454 of NAND gate 446 (coupled to clock input 456 of flip-flop 426) resumes its normal operation of mirroring the logic state of COUNT signal line 436. Gray-code single transition counter 400 returns to the incrementing mode from the decrementing mode if another positive pulse is applied to up/down (U/D) signal 448 at any time while COUNT signal line 436 has a low state. In an alternative embodiment, the switching between incrementing and decrementing modes can be level triggered by inserting an edge detector circuit between U/D signal 448 and inverter 450. Thus, modularized gray-code single transition counter 400 executes both the incrementing and decrementing counting approaches described above in connection with Table 3, while requiring a relatively small number of logic gates, while consuming a relatively small amount of power, and while occupying a relatively small integrated circuit area in comparison to previous approaches. Counter 400 has a relatively fast counting speed due to its relatively small number of logic gates. Moreover, the modularized design of gray-code single transition counter 400 is particularly well-suited for ASIC compiler programs, such that integrated circuit designs produced by ASIC compiler programs are more simplified, easier to troubleshoot, and easier to analyze in terms of operating characteristics.

Although the present invention and its advantages have been described in detail, it should be understood that various changes, substitutions and alterations can be made herein without departing from the spirit and scope of the invention as defined by the appended claims.

What is claimed is:

1. A first-in-first-out memory system, comprising:
a plurality of memory locations each for storing data;
a first count line for outputting a first count signal in response to data being written to one of said memory locations;
a write index counter coupled to said first count line for incrementing a write index in response to each said first count signal;
a second count line for outputting a second count signal in response to data being read from one of said memory locations; and
a read index counter coupled to said second count line for incrementing a read index in response to each said second count signal, wherein said write index counter and said read index counter each comprise an associated modularized single transition counter comprising:
an input module coupled to an associated one of said first and second count lines and having an output;
at least one first module coupled to said associated count line and having an input and an output; and
at least one second module coupled to said associated count line and having an input and an output, wherein said first and second modules are operable to be alternately coupled in series to said input module so that one of said first and second modules has its input coupled to said output of said input module and so that each additional one of said first and second modules has its input coupled to said output of an associated one of said second and first modules, respectively, wherein each said first and second module provides at least one bit of a single transition count such that said single transition count is modified in response to said count signal of said associated count line.

2. The system of claim 1 and further comprising comparison circuitry for comparing said write index against said read index.

3. The system of claim 2 and further comprising indication circuitry coupled to said comparison circuitry for outputting a full flag in response to said write index counter incrementing said write index to equal said read index.

4. The system of claim 2 and further comprising indication circuitry coupled to said comparison circuitry for outputting an empty flag in response to said read index counter incrementing said read index to equal said write index.

* * * * *